United States Patent [19]

Moore

[11] Patent Number: 5,004,708
[45] Date of Patent: Apr. 2, 1991

[54] PYROLYTIC BORON NITRIDE WITH COLUMNAR CRYSTALLINE MORPHOLOGY

[75] Inventor: Arthur W. Moore, North Olmstead, Ohio

[73] Assignee: Union Carbide Corporation, Danbury, Conn.

[21] Appl. No.: 318,349

[22] Filed: Mar. 2, 1989

[51] Int. Cl.$^5$ ............................................. C04B 35/58
[52] U.S. Cl. ......................................... 501/96; 501/94
[58] Field of Search ...................... 501/96, 95; 427/38, 427/39, 255

[56] References Cited

U.S. PATENT DOCUMENTS 4,824,711  4/1989  Cagliostro et al. ................ 425/255

Primary Examiner—William R. Dixon, Jr.
Assistant Examiner—Alan A. Wright
Attorney, Agent, or Firm—E. Lieberstein

[57] ABSTRACT

A pyrolytic boron nitride with a highly oriented crystalline morphology of twinned boron nitride crystallites is produced by addition of a trace amount of zirconium into the boron nitride.

19 Claims, 6 Drawing Sheets

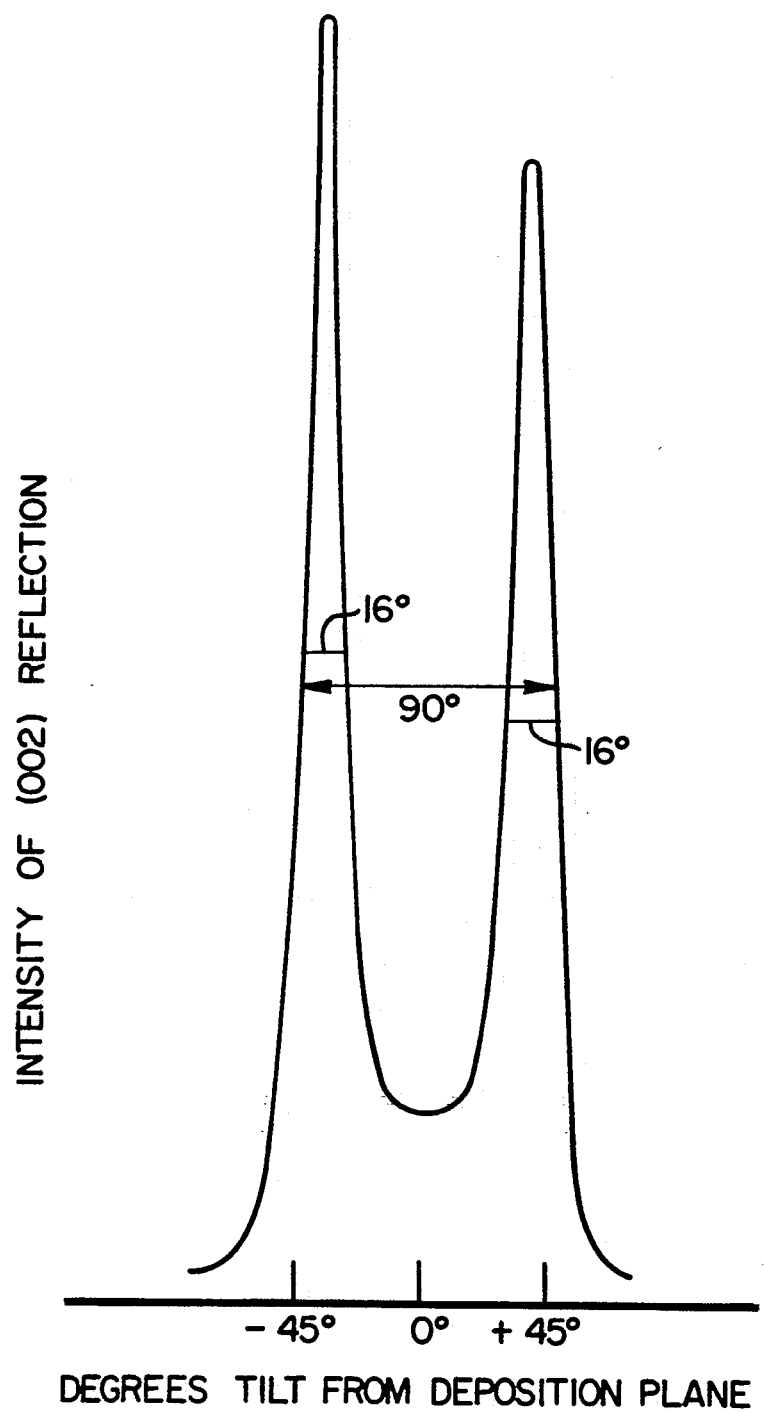
F I G. 5

PYROLYTIC BORON NITRIDE WITH COLUMNAR CRYSTALLINE MORPHOLOGY

FIELD OF THE INVENTION

The present invention relates to pyrolytic boron nitride (PBN) formed by chemical vapor deposition, i.e. by the chemical reaction of gases to form boron nitride upon a substrate.

BACKGROUND OF THE INVENTION

Pyrolytic boron nitride, or chemical vapor deposited (CVD) boron nitride, has been used extensively for the manufacture of refractory shapes. pyrolytic boron nitride shapes have the advantage over sintered boron nitride (BN) shapes in that pyrolytic boron nitride is usually denser and does not contain impurities and unfavorable pores, which are usually found in sintered shapes. Pyrolytic boron nitride shapes are often used as crucibles for melting semiconductor materials, and for high-temperature jigs and insulators. While, pyrolytic boron nitride shapes are satisfactory for many of these refractory uses, boron nitride is subject to physical change under conditions of high mechanical pressure and high temperature. Therefore, there is a continuing need for a refractory which is more stable under high stress and high temperature conditions than is conventional pyrolytic boron nitride.

Another use for pyrolytic boron nitride is as a coating upon graphite shapes to, for example, increase high temperature oxidation resistance, and prevent carbon contamination in semiconductor applications. A problem with boron-nitride coated graphite shapes is that pyrolytic boron nitride has a significantly different coefficient of thermal expansion (CTE) than graphite. This can cause failure of the coating under thermal cycling and high temperature conditions.

Matsuda, et al. in "Synthesis and structure of Chemically vapour-deposited boron nitride" Journal of Materials Science 21 (1986) 649-658, disclose the formation of boron nitride by chemical vapor deposition under conditions to form boron nitride with a mixed morphology, i.e. with regions of turbostratic boron nitride (t-BN), which are lacking in three dimensional ordering, and regions of hexagonal boron nitride (h-BN). Under SEM photography, the surface of a pyrolytic boron nitride plate which was predominately h-BN was disclosed as being composed of pyramidal pentagonal facets. The mixed t-BN/h-BN composition is disclosed as having the same structure as pyrolytic boron nitride commercially available from Union Carbide Corp.

Kurdymov, A. V. et al. in "Twinning in graphite-like boron nitride," Sov. phys. Crystallogr, v.21, p.229-31. No. 2, Mar.-Apr., 1976, disclose twinning in graphite-like boron nitride crystals.

Twinning, as disclosed for example in Kurdymov, is the rotation of a part of the crystal lattice such that the rotated part has a basal plane tilted from the basal plane of another portion the crystal. Twinning may occur more than once in a crystallite. Thus, a boron nitride crystallite may comprise several regions of hexagonal boron nitride with basal planes intersecting and tilted relative to those of neighboring regions. Due to the tilted basal planes, the twinned crystallites often occur with pyramidal pentagonal facets, as disclosed, for example, in Matsuda, et al.

OBJECTS OF THE INVENTION

It is, therefore, an object of the invention to provide a pyrolytic boron nitride composition with a highly crystalline morphology and to provide a method for making the same.

It is also an object of the invention to provide a pyrolytic boron nitride which is more resistant to distortion at high temperatures and pressures than is conventional pyrolytic boron nitride.

It is also an object of the invention to provide a pyrolytic boron nitride with a coefficient of thermal expansion more similar to graphite than conventional boron nitride.

SUMMARY OF THE INVENTION

An embodiment of the invention is a pyrolytic boron nitride composition comprising boron nitride and a trace amount of zirconium, the composition having a bimodal X-ray rocking curve for the 002 plane with a peak X ray intensity between $-35°$ and $-37°$ and a peak X-ray intensity between $+35°$ and $+37°$ from the angle corresponding to deposition plane, each of the two peak intensities having a FWHM less than 30°, preferably less than 20°, wherein the rocking curve has an X-ray intensity at the zero degree angle corresponding to the deposition plane of less than about 20 percent, preferably between about 5 percent and about 15 percent, of either of the two peak intensities.

Another embodiment of the invention is a method for producing a pyrolytic boron-nitride
 (a) introducing a gas stream of a boron containing gas and ammonia gas into a reaction zone;
 (b) introducing zirconium atoms into the gas stream;
 (c) reacting the gas stream under temperature and pressure conditions so as to form a pyrolytic boron nitride composition comprising boron nitride and a trace amount of zirconium, the composition having a bimodal X-ray rocking curve for the 002 plane with a peak X-ray intensity between $-35°$ and $-37°$ and a peak X-ray intensity between $+35°$ and $+37°$ from the angle corresponding to deposition plane, each of the two peak intensities having a FWHM less than 30°, preferably less than 20°, wherein the rocking curve has an X-ray intensity at the zero degree angle corresponding to the deposition plane of less than about 20 percent, preferably between about 5 percent and about 15 percent, of either of the two peak intensities.

By pyrolytic boron nitride is meant chemical vapor deposited (CVD) boron nitride, or boron nitride produced by the vapor-phase reaction of ammonia, and a boron-containing gas such as boron trichloride ($BCl_3$) CVD methods are generally described in U.S. Pat. No. 3,152,006, which is incorporated herein by reference.

The composition of the invention comprises a trace amount of zirconium In order to produce the crystalline morphology of the present invention only a trace of zirconium need be present. By "trace" is meant a sufficient amount of zirconium to form the crystalline morphology as defined by the rocking curve described in the claims, generally an amount of zirconium not exceeding 1 weight percent, typically not exceeding 0.1 weight percent.

The PBN compositions of the invention are characterized by the high proportion of twinned boron nitride crystallites with tilted basal planes, and by the high preferred orientation of the tilted 002 basal planes. The high proportion of these highly oriented and tilted basal planes in the PBN compositions of the invention is shown by so-called "rocking curves." A rocking curve for a particular sample, as the term is used herein and in the claims, is produced by know techniques which involve use of a monochromatic beam of X-rays directed onto the sample.

FIG. 1 is a simplified perspective diagram of an apparatus for producing a rocking curve. An X-ray source 101 with a low source divergence angle, typically 1° or less, directs a monochromatic X-ray beam 103 upon a sample 105. A detector 107 is placed at the 2θ position to detect the reflected X-ray beam 109 from the sample. The reflected beam 109 shows peak intensities at sample angles (φ) corresponding to the Bragg (002) reflections from the basal planes of the crystal lattice of the sample. The angle 2θ at which the X-ray beam is reflected is calculated using Bragg's Law ($\lambda = 2 sine\theta$), where λ is the wave length of the monochromatic X-ray beam, d is the interlayer spacing of the crystal, and θ is the Bragg angle. In the present application, the X-rays were generated with a CuKα (1.54Å wavelength) X-ray source. The sample 105 is rotated about axis A-A within the beam 103. As the sample 105 is rotated, the X-ray intensity is detected, including the intensity peaks corresponding to the Bragg 002 reflections from the basal planes, thus generating a curve of reflected X-ray intensity vs. angle (θ) of rotation of the sample. Such a curve is a preferred orientation diffraction curve or "rocking curve". Thus, the rocking curve is a graph of the intensity of the reflected X-rays as a function of the angular distance from a reference plane, which in the case of pyrolytic graphite and pyrolytic boron nitride is the deposition plane. Therefore, a peak at 0° indicates (002) basal planes parallel to the deposition plane defined by the substrate. A peak on either or both sides of 0°, at for example 37° indicates the presence of crystallites with (002) basal planes tilted at an angle of 37° to the basal plane.

The "FWHM" of a peak on the rocking curve is the Full Width of a peak at one-Half of the Maximum intensity of the peak. FWHM is a measure of the degree of the preferred orientation of the 002 planes, the highly oriented crystal structure producing a smaller FWHM (narrow peak), and a poorly oriented crystal structures producing a larger FWHM (broad peak).

For conventional pyrolytic boron nitride, the rocking curve is generally a broad (high FWHM) Gaussian-shaped distribution curve at 0°. This indicates the presence of some crystalline boron-nitride of the hexagonal form, but the high FWHM indicates a small degree of preferred alignment. In some samples of undoped pyrolytic boron nitride, the rocking curves have two broad peaks on either side of the 0° line. However, the intensity between the peaks (at 0°) is a significant fraction of the maximum of the two side peaks, forming either a bimodal rocking curve with a slight dip between the peaks, or a trimodal curve with a central peak at 0° flanked by the broad side peaks. The relatively high intensity at 0° indicates a high proportion of basal planes aligned parallel to the deposition plane. In addition, the FWHM of the peaks observed for these prior art compositions has been observed as in excess of about 35°. This indicates a low degree of preferred alignment of the twinned phase.

For the compositions of the invention, the rocking curve is bimodal, showing the presence of twinned crystalline boron-nitride. The FWHM of the peaks are much smaller than those of conventional BN, FWHM values as low as 8° having been observed In addition, the intensity of the rocking curve at 0°, the angle corresponding to the deposition plane, is very small compared to the intensity at the two side peaks, and is near zero for some samples. This shows a much higher proportion of the twinned crystalline phase than in prior art compositions, with a relatively smaller amount of crystalline phase with basal planes parallel to the deposition plane. In addition, the low FWHM values of the two peaks show a high degree of preferred orientation of the twinned-crystalline phase to a degree not achieved in the prior art.

In the method of the invention, a boron-containing gas and ammonia are introduced into a reaction zone according to conventional practice for forming CVD boron nitride. The boron-containing gas may be any such gas used in the art, such as $B_2H_6$, $BCl_3$, $BF_3$, $B_3N_3H_6$, $B_3N_3H_3Cl_3$, $B_{10}H_{14}$, $(C_2H_5)_3B$, and the like. The preferred boron-containing gases are $B_2H_6$, and $BCL_3$, more preferably $BCl_3$.

Zirconium is incorporated into the composition of the invention by introducing zirconium atoms into the gas stream of ammonia and boron-containing gas. This may be accomplished by any suitable means. Preferably the zirconium is introduced by placing a solid zirconium source in or near the reaction zone, or introducing a zirconium-containing gas into the gas stream. Solid zirconium sources include, for example, zirconium metal, and zirconia. Suitable zirconium-containing gases include, for example, zirconium tetrachloride. When a solid zirconium source is used, the high temperature required to react the ammonia and boron-containing gas volatilizes atoms from the surface of the zirconium source into the reactant gas stream, which in turn become incorporated into the pyrolytic boron nitride composition.

The temperature and pressure at which the ammonia and boron-containing gas are reacted are sufficient to form a highly oriented, twinned pyrolytic boron nitride produce as defined above, (as shown by the rocking curve). The pressure of the reactant gases (ammonia gas, boron-containing gas, and zirconium containing gas, if used) should be below about 1 torr. The total pressure may be higher if a nonreactive diluent gas is used. If a solid zirconium source is used, the reaction temperature should be sufficient to volatilize amounts of zirconium atoms sufficient to form the twinned crystalline morphology characteristic of the invention. Generally, a temperature above about 1800° C. is suitable.

The nitrogen/boron atomic ratio of the ammonia and boron-containing gases is not critical, but is typically between about 2:1 to about 4:1. Accordingly, for $NH_3$ and $BCl_3$ gases the $NH_3:BCl_3$ molar ratio is typically between about 2:1 and about 4:1.

BRIEF DESCRIPTION OF THE DRAWINGS

FIG. 5 is a rocking curve of a pyrolytic boron nitride composition of the invention.

DESCRIPTION OF THE INVENTION

Figure 1:
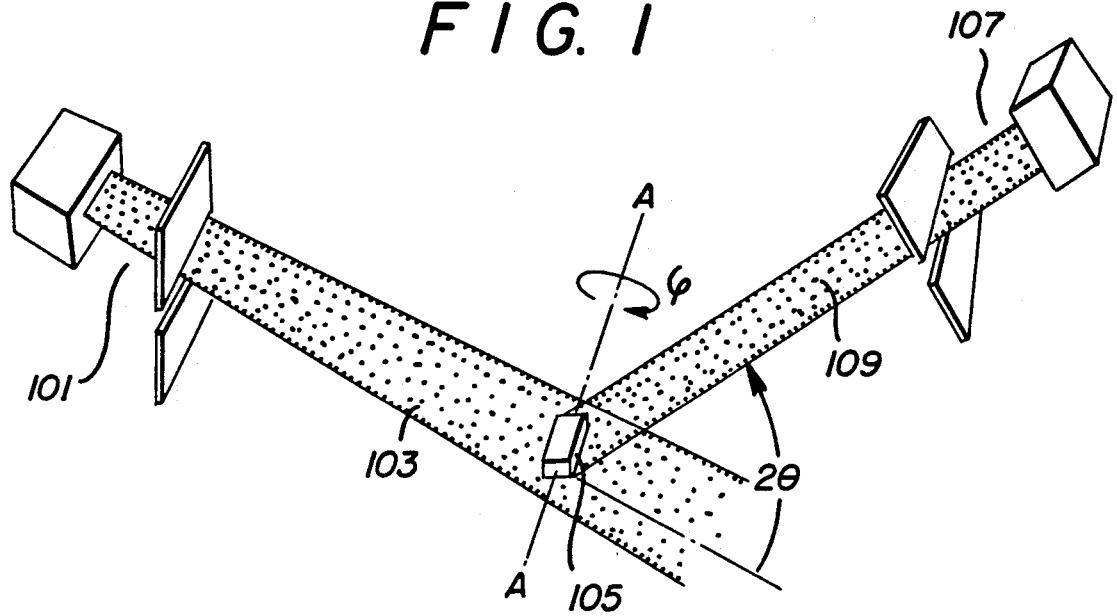
FIG. 1 is a simplified perspective view of an apparatus, discussed above, for producing rocking curves for crystalline samples.

In the examples below pyrolytic boron nitride was prepared using a pilot-plant-size chemical vapor deposition (CVD) chamber illustrated in FIG. 2. The chamber 11 was 12 inches long, and was insulated with graphite felt 13. The chamber 11 was within a stainless steel vacuum chamber (not shown), to permit operation at low pressures, and was surrounded by induction heating coils 15 and a graphite susceptor 17. Reactant gases ($BCl_3$ and $NH_3$) were introduced into the bottom of the deposition chamber 11 through a inlet line 17. Gases were exhausted from the top of the chamber 11 through outlet line 19. On the vertical walls of the chamber 11 were disposed flat graphite plates 21. Also present were graphite mandrels (not shown) of the type used to form PBN crucibles. During operation, a boron nitride deposit 23 formed upon the graphite plates 21 and mandrels.

EXAMPLE 1

(Invention)

Figure 2:
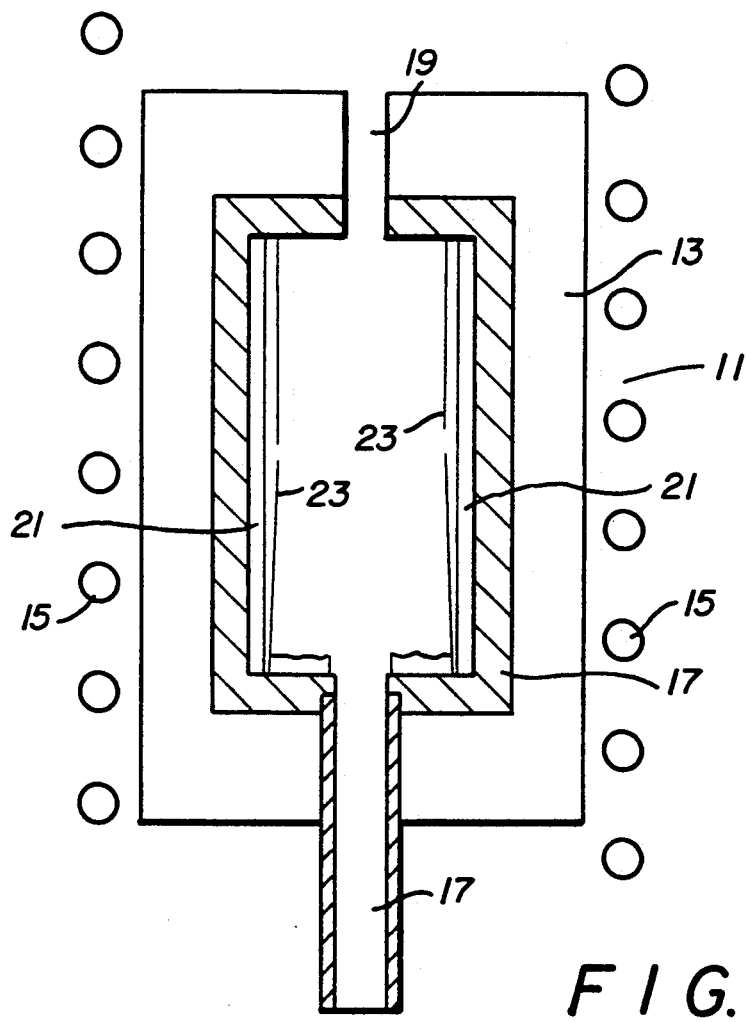
FIG. 2 is a simplified cross-section of the CVD reactor used to prepare pyrolytic boron nitride of the Examples below.

Particles of zirconium metal were placed in pyrolytic boron nitride containers at the bottom of the CVD chamber (see 25 in FIG. 2). The CVD chamber was then placed in the stainless steel vacuum chamber, the chamber was sealed, and a vacuum was then drawn through the outlet line to achieve the operating pressure in the chamber. The chamber was heated by the induction heater to 1890° C. while maintaining the operating pressure. Ammonia ($NH_3$) gas and boron trichloride ($BCl_3$) gas were introduced into the chamber at a molar ratio ($NH_3$:$BCl_3$) of 2.4:1. Growth was initiated upon the flat graphite plates and graphite mandrels. Zirconium atoms were volatilized from the zirconium metal particles due to the high operating temperature of the reactor, and were thereby introduced into the ammonia and boron trichloride gases. From the reactive gases the zirconium atoms were then introduced into the boron nitride forming upon the graphite plates. The reaction was carried out at 460 microns Hg pressure for 8.5 hours. After the furnace cooled, the PBN samples were removed.

Figure 3:
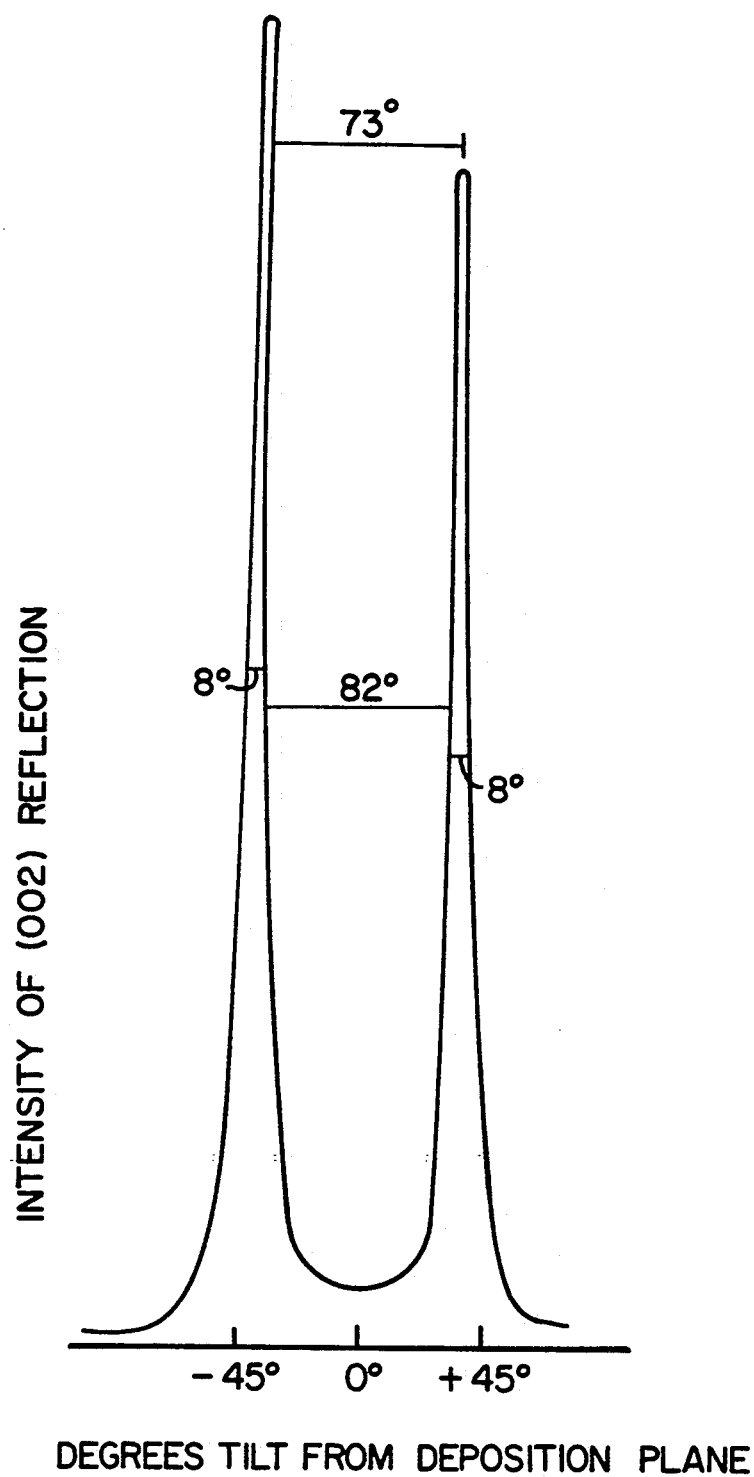
FIG. 3 is a rocking curve of a pyrolytic boron nitride composition of the invention.

The resulting PBN product had a brownish color and a density ranging from 2.22 to 2.24 g/cm$^3$, which is higher than that of conventional PBN made at 1890° C. without zirconium dopant. Spectral and X-ray fluorescence analyses failed to detect more than a trace (°0.1 wt.%) of zirconium in the PBN. A strip was cut from one of the PBN samples and examined by X-ray diffraction. The rocking curve showing the distribution of the orientation for the 002 planes (shown in FIG. 3) showed two sharp peaks with a full width at half maximum (FWHM) of 8°. The two peaks were equally spaced from the diffraction angle corresponding to the deposition plane, and were separated by 73°, with a total effective width of about 82°. As seen in FIG. 3, the intensity at the depression between the peaks (at 0°), is a small fraction, about 5%, of the maximum intensity of the side peaks.

A sample of the PBN of this example was examined by a scanning electron microscope (SEM) and was found to contain a high concentration of columnar microcrystallites, the facets of which were of a pentagonal pyramidal morphology. Based upon an average tilt of 37° of the facets with the deposition plane, the angles between the pyramidal planes were calculated to be 139°, which is the same angle as the theoretical angle (based on crystal structure and interatomic distances) between the basal planes of a twinned boron nitride crystal.

The PBN of this example also had a fairly high CTE in the deposition plane direction ($+1.1 \times 10^{-6}$/°C. at 30° to 100° C.) as compared to conventional PBN (See Example 2 and Table I). Thus, the PBN of this example was more compatible with fine-grained graphite substrates which typically have CTE values of $+2.0 \times 10^{-6}$/°C. or more in the 30° C. to 100° C. range.

A sample of the PBN of this example was hotpressed at 2500° C. and 11,000 psi to test its thermal stability under high pressure. There was no apparent change in the sample after this severe treatment, and the (002) orientation distribution, as shown by a rocking curve, was the same as before the hot-pressing.

EXAMPLE 2

(Comparative)

Figure 4:
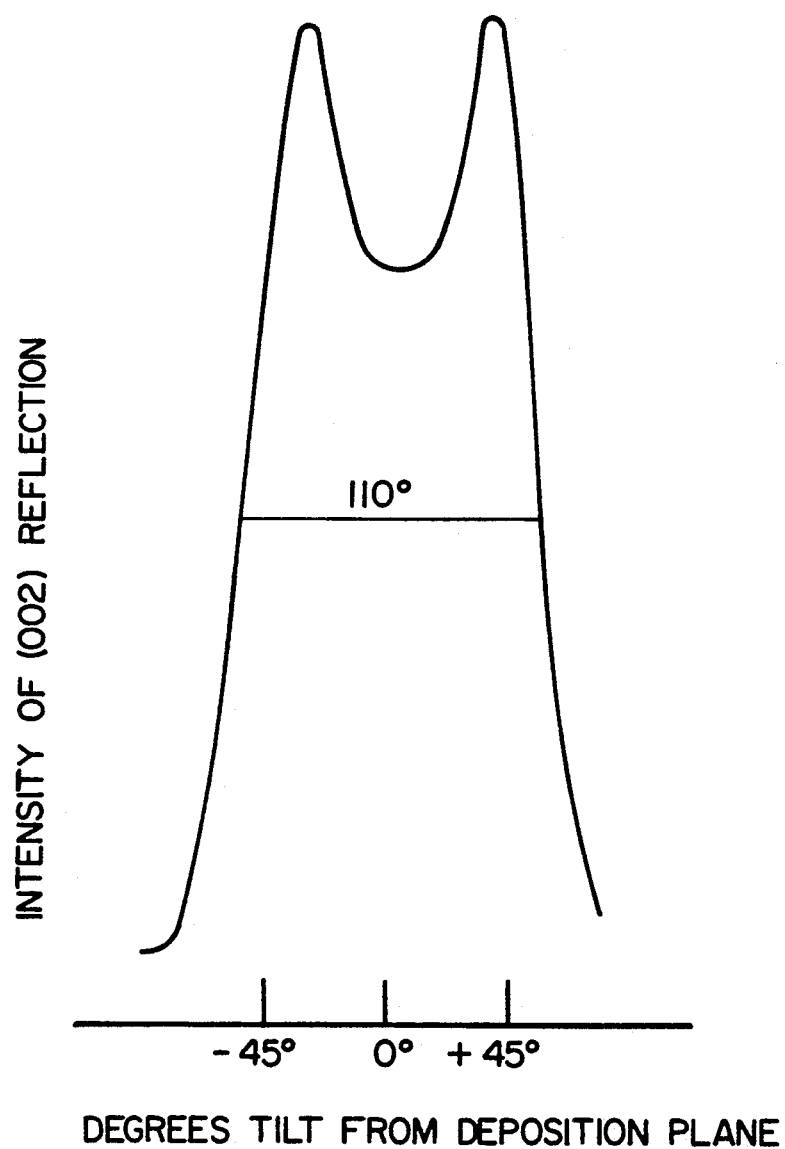
FIG. 4 is a rocking curve of a comparative pyrolytic boron nitride composition.

PBN was produced at the same temperature as in Example 1, except no zirconium was present in the CVD chamber. The conditions of the reaction were those shown in Table I. The PBN product had a near white color typical of conventional PBN and had a density typical of PBN of 2.17 g/cm$^3$. The X-ray rocking curve, shown in FIG. 4, showed two broad intensity peaks with a shallow depression between the peaks. The FWHM across all of the peaks was 110°. The interlayer spacing ($c_o/2$), as determined by standard techniques, was 3.400. This is significantly higher than the interlayer spacing of the PBN according to the invention in Example 1 (3.340). As seen in FIG. 4, the intensity of the depression between the peaks at 0°, is significant, about 75% of the intensity of the side peaks. The interlayer spacing, the high intensity at 0°, and the wide FWHM values show that this sample has a much less oriented structure, was less crystalline, and had a smaller portion of the twinned crystalline component than the PBN according to the invention shown in Example 1.

A sample of the PBN of this example was hotpressed at 2500° C. and 11,000 psi. The sample underwent some deformation as a result and the FWHM across the curves was reduced from 110° to 105°.

EXAMPLE 3

(Invention)

PBN was prepared essentially as in Example 1 with zirconium particles introduced into the reactor, but at a higher reaction temperature of 1970° C. The process conditions are summarized in Table I. The product had a brownish color and a density of 2.24 (g/cm$^3$, which is higher than that of conventional PBN made at 1970° C. X-ray diffraction analysis was conducted, and the rocking curve showing the (002) orientation distribution (FIG. 5) showed two sharp peaks of about 16° FWHM each, which were separated by about 73° from each other and were equally spaced from the angle corresponding to the deposition plane (0°). The effective width across both peaks was 90°. As seen in FIG. 5, the intensity at the depression between the peaks at 0°, is a small fraction, about 15%, of the intensity at the peaks. The CTE for this sample in the 30° C. to 100° C. range was $1.79 \times 10^{-6}/°C.$, which is significantly closer to the CTE of graphite than, for example, the comparative PBN of Example 4 below.

EXAMPLE 4

(Comparative)

Figure 6:
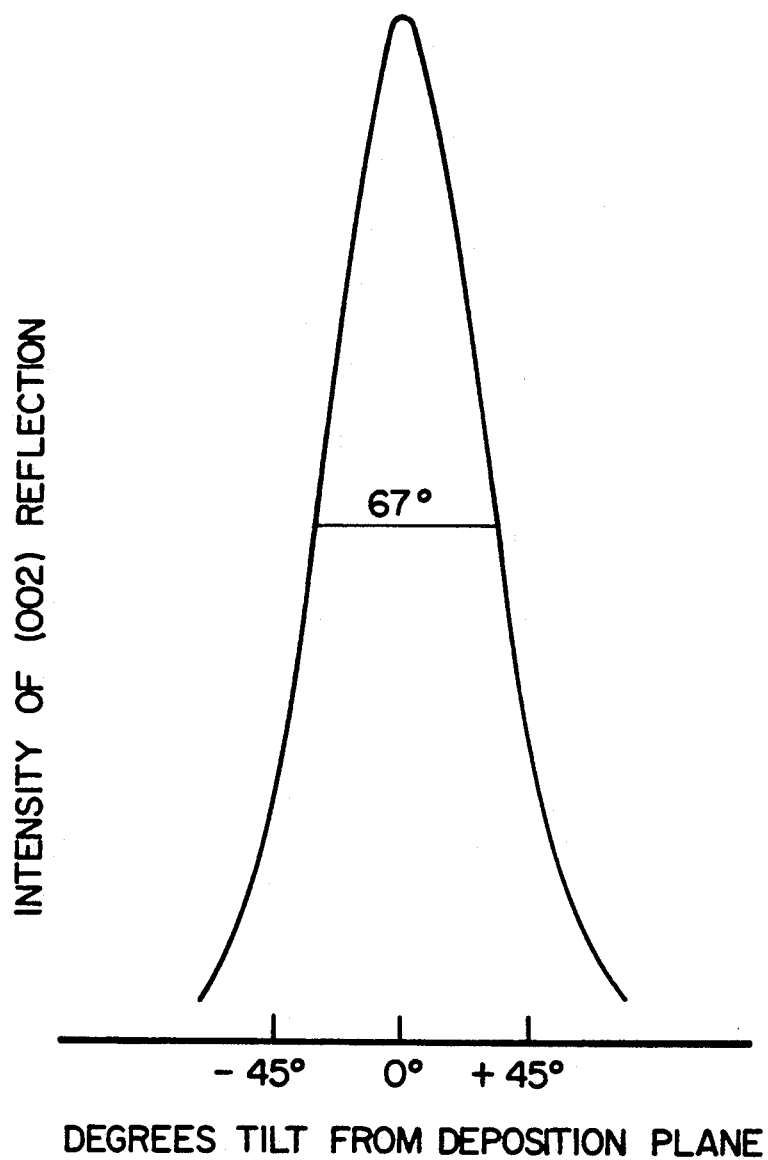
FIG. 6 is a rocking curve of a comparative boron nitride composition.

PBN was prepared at the same temperature in Example 3, at the conditions shown in Table I. No zirconium was present in the CVD chamber The PBN product had a near white color typical of conventional PBN and had a density expected of PBN (2.18 g/cm$^3$) The X-ray rocking curve, shown in FIG. 6, had a single peak with a FWHM of 67°. The rocking curve, when compared to that of Example 3 (FIG. 5), shows a radically different morphology to that of the invention, and shows no evidence of columnar twinned boron nitride crystallites as in the PBN of the invention.

EXAMPLES 5 and 6

(Comparative)

Figure 7:
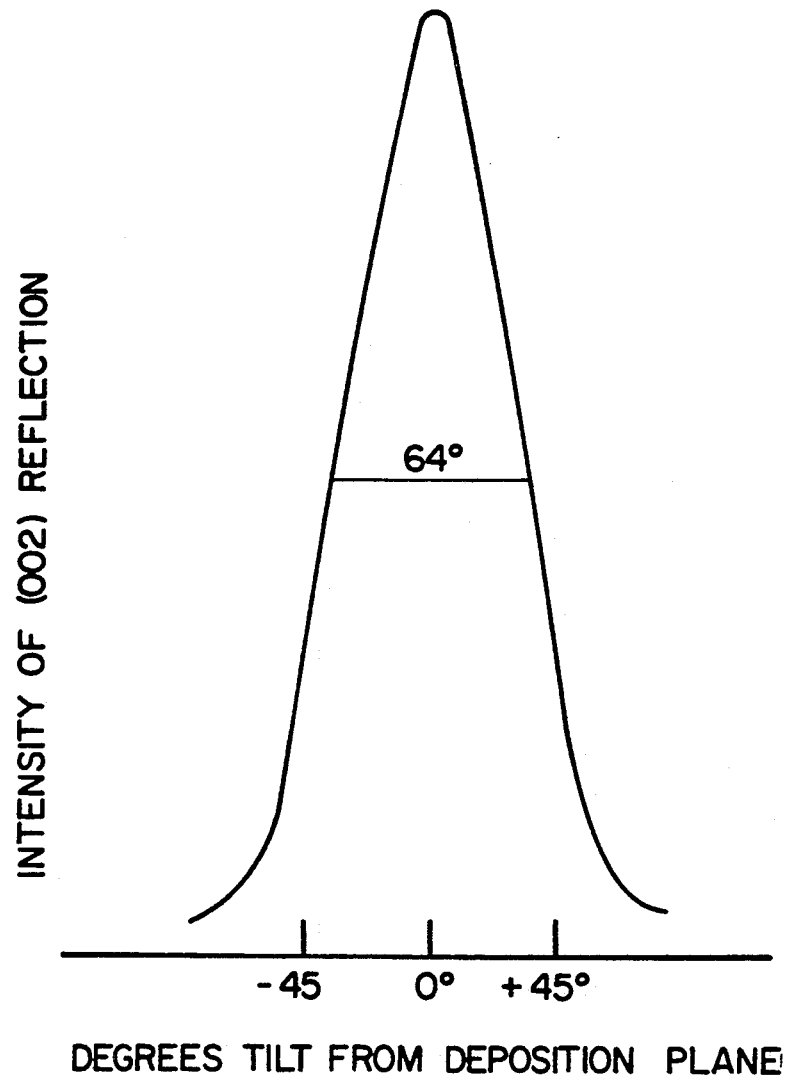
FIG. 7 is a rocking curve of a comparative boron nitride composition.

PBN was prepared by the method in Example 1 at a lower reaction temperature of 1675° C. Two tests were run, the first (Example 5) with zirconium in the CVD chamber, and the second (Example 6) with no zirconium in the CVD chamber. The process conditions are shown in Table I. Both samples yielded X-ray rocking curves with a single peak. For Example 5 with the zirconium, the rocking curve (shown in FIG. 7) had a FWHM of 64°, the interlayer spacing $c_o/2$ was 3.420, and the density was 1.85 g/cm$^3$. These structural parameters are typical of conventional PBN. For Example 6 without the zirconium, the density was 1.80 g/cm$^3$, with a similar rocking curve and interlayer spacing of Example 5. These results show that a PBN according to the invention with the twinned columnar crystalline morphology cannot be produced in this reaction system at a deposition temperature of 1675° C.

The results of Examples 1 to 6 are summarized below in Table I. The density, $c_o/2$, and CTE values were determined by standard techniques.

EXAMPLES 7 to 10

(Comparative)

Pyrolytic boron nitride was produced essentially as in Example 1, except no zirconium was introduced. In the place of zirconium, another element was introduced, carbon, silicon, or an element in the same column on the periodic table as zirconium (titanium or hafnium). The elements and the manner in which atoms of the elements were introduced into the NH$_3$/BCl$_3$ gas stream are shown below in Table II. The solid materials were placed into the reactor in a manner similar to the zirconium particles in Example 1.

TABLE II

| PBN with Comparative Elements | | |
|---|---|---|
| | Element | Method |
| Example 7 | C | CH$_4$ was introduced into the NH$_3$/BCl$_3$ gas stream as a carbon source. |
| Example 8 | Si | SiHCl$_3$ was introduced into the NH$_3$/BCl$_3$ gas stream as a silicon source. |
| Example 9 | Ti | Ti particles were placed in the reactor as a titanium source. |
| Example 10 | Hf | HfO$_2$ particles were placed in the reactor as a hafnium source. |

A rocking curve for the 002 plane was produced for each PBN sample. None of the samples produced a bimodal curve, and, thus, did not possess the highly oriented twinned crystalline morphology of the PBN of the invention.

These examples illustrate that mere introduction of a dopant into PBN, even those of a similar chemistry to zirconium, will not produce the highly oriented, twinned morphology of the composition of the present invention.

While this invention has been described with reference to certain specific embodiments and examples, it will be recognized by those skilled in the art that many variations are possible without departing from the scope and spirit of this invention, and that the invention, as described by the claims, is intended to cover all changes

TABLE I

| | PBN Process Conditions & Properties | | | | | | | |
|---|---|---|---|---|---|---|---|---|
| | Deposition Conditions | | | | PBN Properties | | | |
| Example | Temp. (°C.) | Pressure (microns) | NH$_3$/BCl$_3$ Ratio | Time (hrs.) | Density (g/cm$^3$) | FWHM$_{002}$ | $c_o/2$ CTE, Å | 30-100° C. ($10^{-6}/°C.$) |
| 1 Invention | 1890 | 460 | 2.4 | 8.5 | 2.22-2.24 | (82°)$^{(1)}$ | 3.34 | +1.10 |
| 2 Conventional | 1890 | 450 | 3.0 | 8.3 | 2.17 | (110°)$^{(2)}$ | 3.40 | +1.04 |
| 3 Invention | 1970 | 500 | 2.4 | 8.0 | 2.24 | (90°)$^{(3)}$ | 3.34 | +1.79 |
| 4 Conventional | 1970 | 540 | 3.0 | 7.5 | 2.18 | 58°-74° | 3.36-3.38 | +0.92 |
| 5 Invention | 1675 | 480 | 4.6 | 8.0 | 1.85-1.88 | 64° | 3.42 | −0.35 |
| 6 Comp. | 1675 | 480 | 4.6 | 8.0 | 1.8 | 65° | 3.43 | −0.23 |

$^{(1)}$Two peaks, each 8° FWHM separated by 73° for effective FWHM of 82°.
$^{(2)}$Two peaks, each 36° FWHM separated by 73° for effective FWHM of 110°.
$^{(3)}$Two peaks, each 16° FWHM separated by 73° for effective FWHM of 90°.

The results of the above examples show that PBN with highly oriented columnar crystalline morphology can be obtained by introducing trace amounts of zirconium at a reaction temperature 1800 to 2000° C. into the reaction system. The FWHM of the pair of peaks associated with the morphology characteristic of the invention (with zirconium) can be as low as 8°. With conventional PBN (no zirconium introduced), bimodal peaks indicating twinning are either non-existent or, if present, are broad with FWHM values in excess of about 35°.

and modifications of the invention which do not depart from the spirit of the invention.

What is claimed is:

1. A pyrolytic boron-nitride composition comprising boron nitride and a trace amount of zirconium, the composition having a bimodal X-ray rocking curve for the 002 plane with a peak X-ray intensity between −35° and −37° and a peak X-ray intensity between +35° and +37° from the angle corresponding to deposition plane, each of the two peak intensities having a FWHM less than 30°, wherein the rocking curve has an X-ray intensity at the zero degree angle corresponding to the deposition plane of less than about 20 percent of either of the two peak intensities.

2. The composition of claim 1 wherein the FWHM for each X-ray peak intensity is less than 20°, and the intensity at the zero degree angle is between about 5 percent and about 15 percent of either of the two peak intensities.

3. The composition of claim 1 wherein the maximum amount of zirconium is 1 weight percent.

4. The composition of claim 1 wherein the maximum amount of zirconium is 0.1 weight percent.

5. A method for producing a pyrolytic boron-nitride composition which comprises;
   (a) introducing a gas stream of a boron-containing gas and ammonia gas into a reaction zone;
   (b) introducing zirconium atoms into the gas stream;
   (c) reacting the gas stream at a temperature of greater than about 1800° C. and under pressure conditions to form a pyrolytic boron nitride composition comprising boron nitride and a trace amount of zirconium, the composition having a bimodal X-ray rocking curve for the 002 plane with a peak X-ray intensity between $-35°$ and $-37°$ and a peak X-ray intensity between $+35°$ and $+37°$ from the angle corresponding to deposition plane, each of the two peak intensities having a FWHM less than 30°, wherein the rocking curve has an X-ray intensity at the zero degree angle corresponding to the deposition plane of less than about 20 percent of either of the two peak intensities.

6. The method of claim 5 wherein the temperature at which the gas stream is reacted in (c) is between about 1800° C. and about 2000° C.

7. The method of claim 5 wherein the pressure at which the gas stream is reacted in (c) is less than 1 torr.

8. The method of claim 5 wherein the nitrogen to boron atomic ratio in the gas stream is between about 2:1 to about 4:1.

9. The method of claim 5 wherein the boron-containing gas is selected from the group consisting of $B_2H_6$, $BCl_3$, $BF_3$, $B_3N_3H_6$, $BN_3H_3Cl_3$, $B_{10}H_{14}$, and $(C_2H_5)_3B$.

10. The method of claim 5 wherein the boron-containing gas is selected from the group consisting of $B_2H_6$, and $BCl_3$ 11. The method of claim 5 wherein the boron-containing gas is $BCl_3$.

12. The method of claim 11 wherein the molar ratio of ammonia gas to $BCl_3$ gas is between about 2:1 and about 4:1.

13. The method of claim 5 wherein the FWHM for each X-ray peak intensity is less than 20°, and the intensity at the zero degree angle is between about 5 percent and about 15 percent of the either of the two peak intensities.

14. The method of claim 5 wherein the amount of zirconium introduced into the gas stream is in an amount to form a composition with less than 1 weight percent zirconium.

15. The method of claim 5 wherein the amount of zirconium introduced into the gas stream is in an amount to form a composition with less than 0.1 weight percent zirconium.

16. The method of claim 5 wherein the zirconium atoms are introduced into the gas stream in (b) by placing a solid zirconium source sufficiently near the reaction zone such that at the temperature of the reaction in (c) the zirconium atoms volatilize from the zirconium source into the gas stream.

17. The method of claim 16 wherein the solid zirconium-source is chosen from the group consisting of zirconium metal, and zirconia.

18. The method of claim 5 wherein the zirconium atoms are introduced into the gas stream in (b) by introducing a gaseous zirconium-source into the gas stream.

19. The method of claim 18 wherein the gaseous zirconium-source is zirconium tetrachloride.

* * * * *

UNITED STATES PATENT AND TRADEMARK OFFICE
CERTIFICATE OF CORRECTION

PATENT NO. : 5,004,708
DATED : April 2, 1991
INVENTOR(S) : Arthur William Moore

It is certified that error appears in the above-identified patent and that said Letters Patent is hereby corrected as shown below:

Column 2, line 31, after the word "boron-nitride", "composition which comprises:" was left out.

Column 2, line 57, after the word "zirconium" "." was left out.

Column 3, line 12, "2OΘ" should read "2Θ".

Column 3, line 18, "2sineΘ" should read "2dsineΘ".

Column 4, line 2, "observed" should read "observed.".

Column 4, line 42, "produce" should read "product".

Column 10, line 3, "BN$_3$H$_3$Cl$_3$" should read "B$_3$N$_3$H$_3$Cl$_3$".

Signed and Sealed this

Twenty-second Day of September, 1992

Attest:

DOUGLAS B. COMER

*Attesting Officer*  *Acting Commissioner of Patents and Trademarks*